United States Patent
Kamata

(10) Patent No.: US 9,024,430 B2
(45) Date of Patent: May 5, 2015

(54) SEMICONDUCTOR DEVICE

(71) Applicant: Kabushiki Kaisha Toshiba, Tokyo (JP)

(72) Inventor: Shuji Kamata, Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/194,593

(22) Filed: Feb. 28, 2014

(65) Prior Publication Data

US 2015/0069589 A1    Mar. 12, 2015

(30) Foreign Application Priority Data

Sep. 11, 2013    (JP) .................................. 2013-188370

(51) Int. Cl.
  *H01L 23/48*    (2006.01)
  *H01L 29/73*    (2006.01)
  *H01L 23/34*    (2006.01)
  *H01L 23/495*    (2006.01)

(52) U.S. Cl.
  CPC .... *H01L 23/49541* (2013.01); *H01L 23/49575* (2013.01)

(58) Field of Classification Search
  CPC .................. H01L 23/49541; H01L 23/49575
  USPC .................. 257/181, 182, 688, 719
  See application file for complete search history.

(56) References Cited

U.S. PATENT DOCUMENTS

| | | | | |
|---|---|---|---|---|
| 4,399,452 A | * | 8/1983 | Nakashima et al. | 257/689 |
| 5,121,189 A | * | 6/1992 | Niwayama | 257/688 |
| 5,345,096 A | * | 9/1994 | Gruning | 257/182 |
| 5,777,351 A | * | 7/1998 | Taguchi et al. | 257/181 |

FOREIGN PATENT DOCUMENTS

JP    H09232345 A    9/1997

* cited by examiner

*Primary Examiner* — Luan C Thai
(74) *Attorney, Agent, or Firm* — Patterson & Sheridan, LLP

(57) ABSTRACT

A semiconductor device includes a semiconductor element in a frame body. The semiconductor element includes a first electrode electrically connected to an electrode block provided on a first side of the semiconductor element. A connection element, which in some embodiments may be a portion of the electrode block, connects the electrode block to the frame body. The semiconductor element is sealed within an enclosure formed at least in part by the frame body, the connection element, and the electrode block. The connection element includes a fragile portion which has a resistance to increases in pressure or temperature that is less than other portions of the connection element. That is, in general, the fragile portion will fail before other portions of the connection element when pressure or temperature increases, which may occur when, for example, the semiconductor element breaks down.

20 Claims, 8 Drawing Sheets

SEMICONDUCTOR DEVICE

CROSS-REFERENCE TO RELATED APPLICATION

This application is based upon and claims the benefit of priority from Japanese Patent Application No. 2013-188370, filed Sep. 11, 2013, the entire contents of which are incorporated herein by reference.

FIELD

Embodiments described herein relate generally to a semiconductor device.

BACKGROUND

A pressure-contact semiconductor device realizes increased power density by two-surface heat release, and high reliability under a high voltage and a large current. A pressure-contact semiconductor device has a structure wherein a semiconductor element inside an insulating frame body is sandwiched by upper and lower electrode blocks and hermetically sealed. Internal electrical contact is maintained by a pressing force being exerted on the upper and lower electrode blocks from the exterior.

A pressure-contact semiconductor device is such that, even when an internal semiconductor element breaks down, the semiconductor device itself short-circuits without being damaged. Because of this, there is an advantage in that redundant design is easy, such as by using pressure-contact semiconductor devices connected in series so that operation is possible without immediately stopping the system even after the breakdown of a semiconductor element.

However, when an overload state continues with a broken down semiconductor element, fusion of the semiconductor element occurs due to a temperature rise, and there is concern that the internal pressure of the pressure-contact semiconductor devices will rise, ultimately resulting in a possible explosion. If explosion occurs, fragments of the semiconductor device scatter, which will likely damage circuits and cooling devices on the periphery of the semiconductor device, and there is concern that the system will become inoperative.

DETAILED DESCRIPTION

Figure 1A:
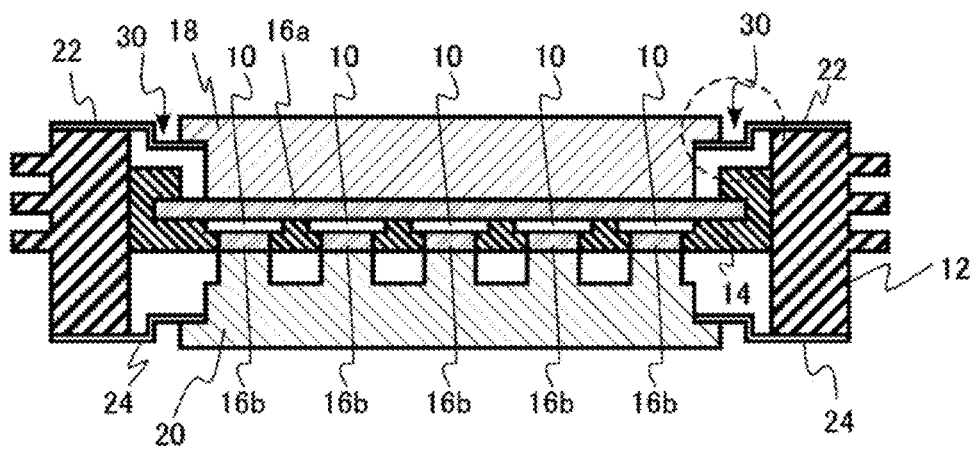
FIGS. 1A to 1C are schematic views of a semiconductor device according to a first embodiment.

An embodiment of the present disclosure provides a pressure-contact semiconductor device that has high reliability.

According to an embodiment, a semiconductor device includes at least one semiconductor element disposed in a frame body. The at least one semiconductor element includes a first electrode electrically connected to a first electrode block provided on a first side of the at least one semiconductor element. A first connection element, which in some embodiments may be a portion of the first electrode block, connects the first electrode block to the frame body. The semiconductor element is sealed within an enclosure formed at least in part by the frame body, the first connection element, and the first electrode block. The first connection element includes a fragile portion which has a resistance to increases in pressure or temperature that is less than other portions of the first connection element. That is, in general, the fragile portion is intended to fail before other portions of the first connection element when pressure or temperature increases, which may occur when, for example, the semiconductor element breaks down. In some embodiments, the fragile portion may be provided in a plurality of locations in the first connection element.

In general, according to one embodiment, a semiconductor device includes a frame body, a semiconductor element disposed in the frame body, and including a first electrode on a first surface thereof and a second electrode on a second surface thereof on the side opposite to the first surface, a first electrode block provided on the first surface side and electrically connected to the first electrode, a first connection portion that connects the first electrode block and the frame body, a second electrode block provided on the second surface side and electrically connected to the second electrode, and a second connection portion that connects the second electrode block and the frame body. In the semiconductor device, the first connection portion or second connection portion locally includes a fragile portion with low resistance against pressure or temperature.

Hereafter, a description of embodiments will be given while referring to the drawings. In the following description, the same reference numerals are given to similar components depicted in different figures, and repeated descriptions of elements or components may be omitted as appropriate.

First Embodiment

A semiconductor device according to this embodiment includes an insulating frame body, a semiconductor element disposed in the frame body and including a first electrode on a first surface thereof and a second electrode on a second surface thereof on the side opposite to the first surface, a first electrode block provided on the first surface side and electrically connected to the first electrode, a first connection portion that connects the first electrode block and the frame body, a second electrode block provided on the second surface side and electrically connected to the second electrode, and a second connection portion that connects the second electrode block and the frame body. In the semiconductor device, the first connection portion or second connection portion locally includes a what may be referred to as a "fragile portion," which has low resistance against pressure—that is, the "fragile portion" will tend to break before other portions of the connection portion due to pressure increases and consequentially the connection portion may break at the localized fragile portion(s) upon being subjected to an increased pressing force (pressure). In some embodiments, the fragile portion may be relatively more susceptible to temperature increases than the other portions of the connection portion. That is, the fragile portion may, for example, melt at a lower temperature than the other portions of the connection portion.

Figure 1B:
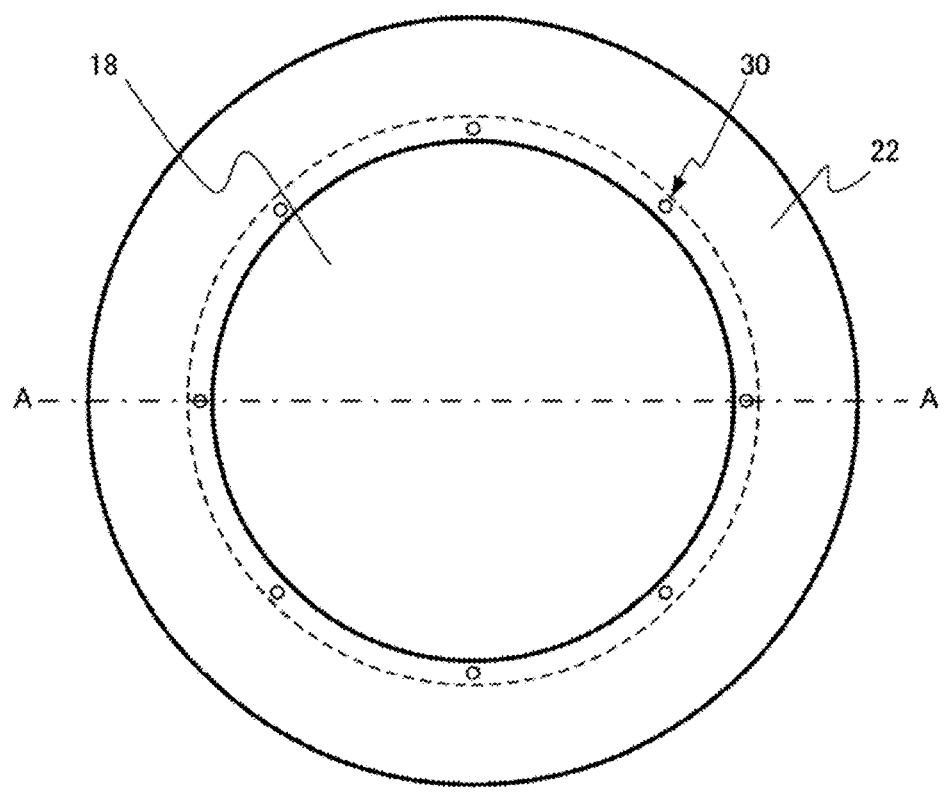
Figure 1C:
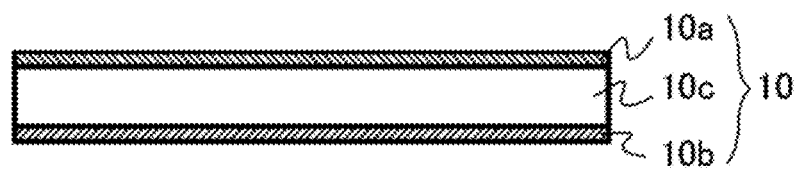

FIGS. 1A to 1C are schematic views of the semiconductor device according to this embodiment. FIG. 1A is a schematic sectional view, FIG. 1B is a schematic top view, and FIG. 1C is a schematic sectional view of the semiconductor element. The semiconductor device according to this embodiment is a pressure-contact semiconductor device. FIG. 1A is a sectional view along AA of FIG. 1B.

The semiconductor device according to this embodiment is such that a plurality of semiconductor elements 10 is disposed in the interior thereof. As shown in FIG. 1C, the semiconductor element 10 includes a first electrode 10a on a first surface thereof and a second electrode 10b on a second surface thereof on the side opposite to the first surface. The region between the first electrode 10a and second electrode 10b is a semiconductor element region 10c.

The semiconductor element 10 is, for example, a silicon PIN diode. The first electrode 10a is, for example, an anode electrode. The second electrode 10b is, for example, a cathode electrode.

The semiconductor element 10 is disposed in an insulating frame body 12. The insulating frame body 12 is, for example, cylindrical, and formed of a ceramic.

The plurality of semiconductor elements 10 are supported by a resin frame 14. The resin frame 14 maintains the distance between a semiconductor termination region and the semiconductor elements 10, and may have a function of aligning the plurality of semiconductor elements 10.

Also, a heat compensation plate (metal plate) 16a is provided on the first surface side of the semiconductor element 10, and a heat compensation plate 16b is provided on the second surface side of the semiconductor element 10. A material with a thermal expansion coefficient which is close to that of the semiconductor element 10 is used for the heat compensation plate 16a and heat compensation plate 16b. For example, when the semiconductor element 10 comprises silicon, then molybdenum, which has a thermal expansion coefficient which is close to that of silicon, is can be used as the material of the heat compensation plates 16a and 16b.

A first electrode block 18 is provided on the first surface side of the semiconductor element 10. Also, a second electrode block 20 is provided on the second surface side of the semiconductor element 10. The first electrode block 18 and second electrode block 20 are, as depicted in this example embodiment, circular.

The first electrode block 18 is provided in contact with the heat compensation plate 16a, and the second electrode block 20 is provided in contact with the heat compensation plate 16b. The first electrode block 18 and second electrode block 20 are formed of a metal, for example, copper.

The first electrode block 18 and frame body 12 are connected by a first flange (first connection element) 22. The first flange 22 is formed of a metal, for example, an iron-nickel alloy.

The first electrode block 18 and first flange 22 may be connected by, for example, welding. The first flange 22 and frame body 12 may be connected by, for example, brazing.

The second electrode block 20 and frame body 12 are connected by a second flange (second connection element) 24. The second flange 24 is formed of a metal, for example, an iron-nickel alloy.

The second electrode block 20 and second flange 24 may be connected by, for example, welding. Also, the second flange 24 and frame body 12 may be connected by, for example, brazing.

The interior of the semiconductor device in which the semiconductor elements 10 are housed is effectively hermetically sealed by the combination of frame body 12, first electrode block 18, second electrode block 20, first flange 22, and second flange 24. The interior of the semiconductor device is filled with an inert gas, for example, nitrogen gas. By filling with an inert gas, the internal semiconductor element 10, heat compensation plate 16a, heat compensation plate 16b, and the like, are thus prevented from oxidizing.

The first flange 22 and second flange 24 are, for example, metal plates, and have spring characteristics of an appropriate strength. Because of this, when a pressing force is applied to the first electrode block 18 and second electrode block 20 from the exterior of the semiconductor device, the semiconductor element 10, heat compensation plate 16a, heat compensation plate 16b, first electrode block 18, and second electrode block 20 come will come into increasingly close contact with each other, and thus good electrical contact is maintained in the semiconductor device. The first electrode block 18 has electrical continuity with the first electrode 10a, and the second electrode block 20 has electrical continuity with the second electrode 10b.

The first flange 22 includes a fragile portion 30, which is a region having a locally low resistance against pressure. Here, the fragile portion 30 is provided in a plurality of places, for example, eight symmetrical places in symmetrical positions about the circumference of the first flange 22, as depicted in FIG. 1B.

Figure 2A:
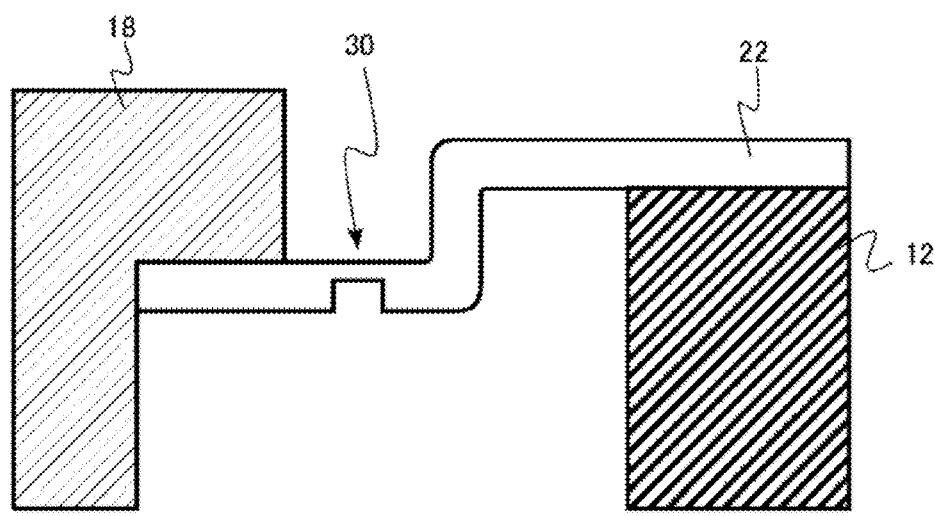
FIGS. 2A and 2B are schematic views of a main portion of the semiconductor device according to the first embodiment.
Figure 2B:
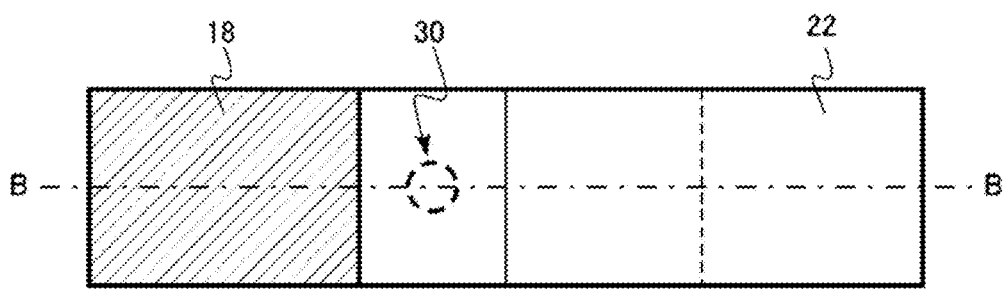

FIGS. 2A and 2B, being schematic views of a portion of the semiconductor device according to this embodiment, are enlarged views of the portion indicated by the dotted circle in FIG. 1A. FIG. 2A is a schematic sectional view, and FIG. 2B is a schematic top view. FIG. 2A is a sectional view along BB of FIG. 2B.

The fragile portion 30 is a circular recess formed in the portion of the surface of the first flange 22 that is inside the bent portion of first flange 22 (depicted as a dotted line in FIG. 1B). As depicted in FIG. 2A, the circular recess is formed in the surface of the first flange 22 from the semiconductor element 10 side. That is, the circular recess is formed on the underside (from bottom of page in FIG. 1B) of flange 22. By providing a circular recess, the fragile portion 30 forms a portion wherein the thickness of the first flange 22 is locally thinned.

Consequently, the fragile portion 30 has relatively low mechanical strength, and a low resistance to pressure. The thickness and shape of the fragile portion 30 are set such that that the fragile portion 30 has the lowest resistance to pressure of the whole configuration of the semiconductor device including the first flange 22 and second flange 24.

The first flange 22 and second flange 24 are formed of thin metal plates in order to have spring characteristics. Consequently, formation of the fragile portion 30 is easy.

For example, when an overload state continues after the semiconductor element 10 breaks down and short circuits, fusion of the semiconductor element may occur due to a temperature rise, and there is concern that the internal pressure will concomitantly rise, resulting in explosion. When an explosion occurs, fragments of the semiconductor device scatter, causing damage to circuits, cooling devices, and the like, on the periphery of the semiconductor device, and there is concern that the system incorporating the semiconductor device will become overall inoperative.

According to this embodiment, however, by providing the fragile portion 30 with locally low resistance against pressure, the fragile portion 30 breaks before the internal pressure increase to the point of causing an explosion. Because of this, the pressure built-up inside the semiconductor device is released, thus preventing explosion. Therefore, fragments of the semiconductor device which would likely be produced in an explosion are prevented from scattering and damaging circuits, cooling devices, and the like, on the periphery of the semiconductor device.

Also, by providing the fragile portion 30, it is possible to predict the place or places in which the semiconductor device will break down if the semiconductor element 10 breaks down. Consequently, it is possible to design the system incorporating the device with fragile portion 30 such that circuits, parts, and the like, susceptible to damage are not disposed in the vicinity of the fragile portion 30. Thus, it is possible to further forestall secondary damage to the system by accounting for the positions of the fragile portions 30 within the overall design of the system such that any breakdown of the fragile portions 30 will tend not to inflict damage on surrounding components.

As heretofore described, according to this embodiment, a pressure-contact semiconductor device that suppresses explosion and has high reliability is realized.

It is preferable that the fragile portion 30 has resistance to pressure that is between two times or more and ten times or less than the pressure inside the frame body 12 at room temperature. When the resistance is below the above-mentioned range, there is concern that the fragile portion 30 will break down even though the semiconductor element 10 has not broken down. When the resistance exceeds the above-mentioned range, there is concern that explosion of the semiconductor device will occur before the fragile portion 30 breaks down.

Although the above description includes the fragile portion 30 being provided in the first flange 22 as an example, the fragile portion 30 may be provided in the second flange 24 in addition to or alternatively to the first flange 22.

Also, the shape of the recess forming the fragile portion 30, not being limited to circular, may be another shape, such as triangular or quadrangular. The recess may be referred to as a "groove" formed in the first flange 22 (or second flange 24) and need not have a specific polygonal shape.

Second Embodiment

The semiconductor device according to this second embodiment is similar to the first embodiment, excepting that the fragile portion having locally low resistance to pressure is formed of intersecting slits rather than as a recess, and the position at which the fragile portion are formed may also differ.

Figure 3A:
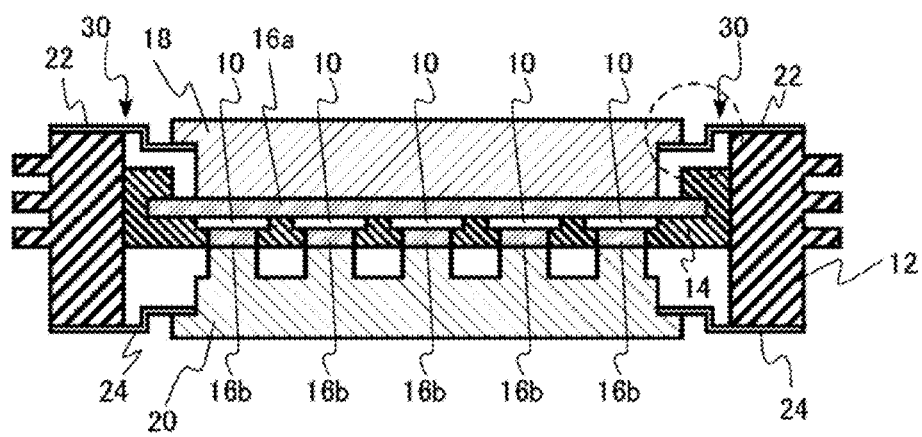
FIGS. 3A and 3B are schematic views of a semiconductor device according to a second embodiment.
Figure 3B:
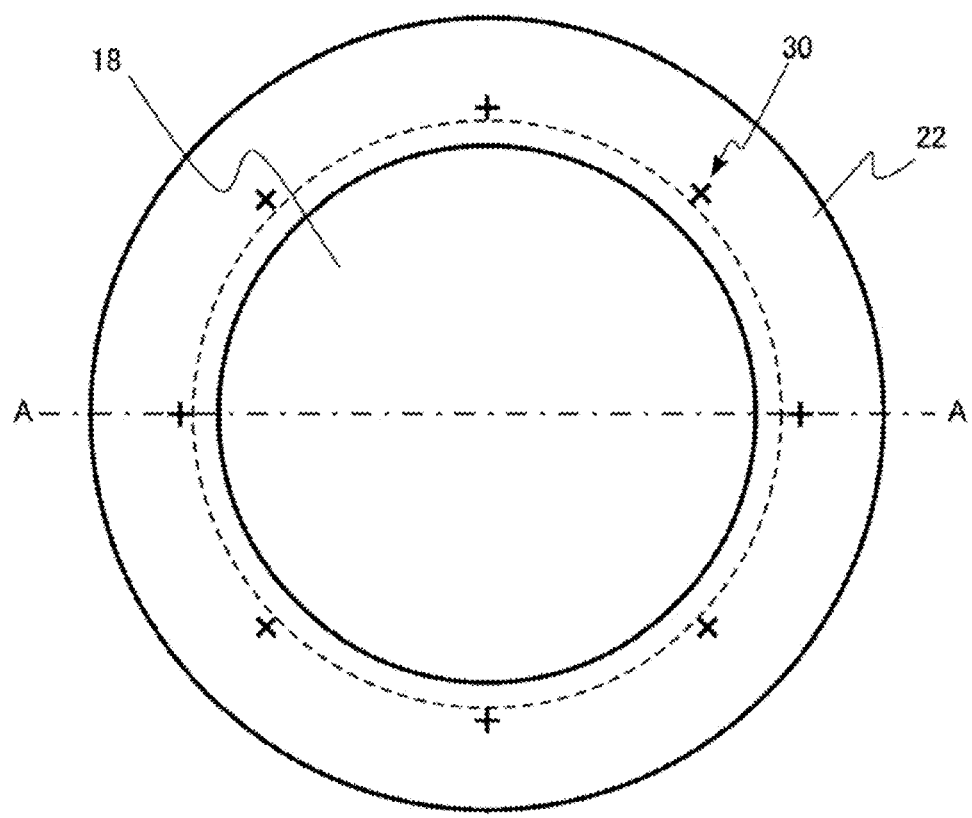

FIGS. 3A and 3B are schematic views of the semiconductor device according to this embodiment. FIG. 3A is a schematic sectional view, and FIG. 3B is a schematic top view. FIG. 3A is a sectional view along AA of FIG. 3B.

As depicted in this embodiment, the first flange 22 includes the fragile portion 30. The fragile portion 30 is provided in a plurality of places, for example, eight symmetrical positions about the circumference of the first flange 22, as shown in FIG. 3B.

Figure 4A:
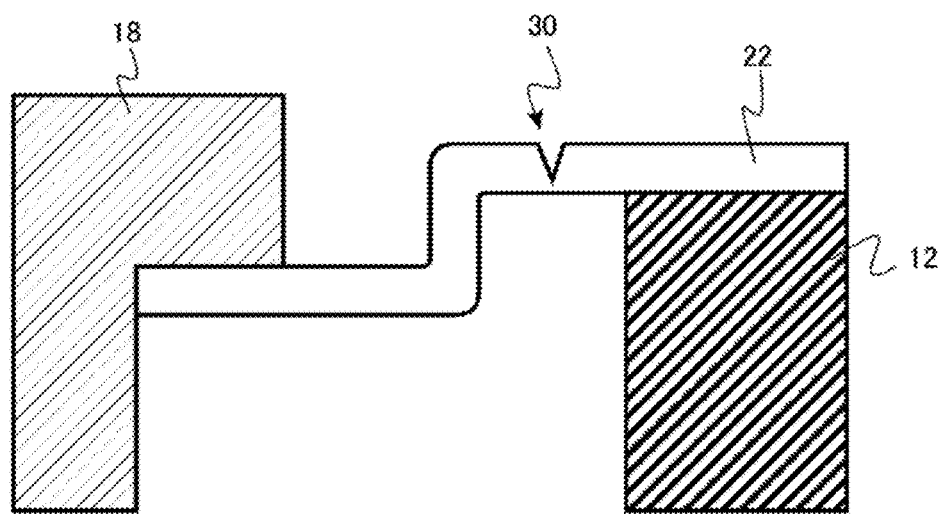
FIGS. 4A and 4B are schematic views of a main portion of the semiconductor device according to the second embodiment.
Figure 4B:
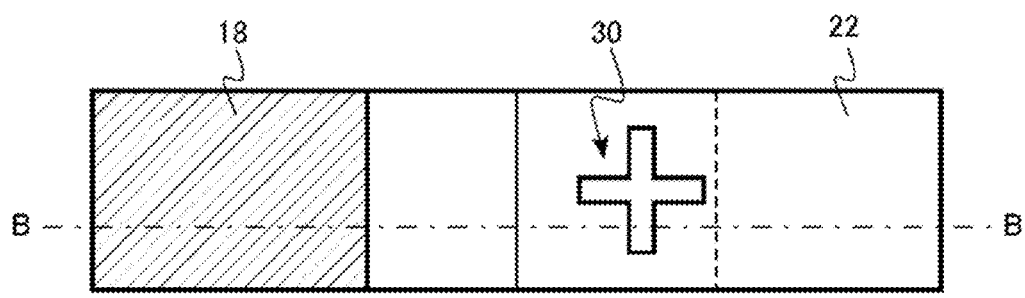

FIGS. 4A and 4B are schematic views of a main portion of the semiconductor device according to this embodiment. FIGS. 4A and 4B are enlarged views of the portion indicated by the dotted circle in FIG. 3A. FIG. 4A is a schematic sectional view, and FIG. 4B is a schematic top view. FIG. 4A is a sectional view along BB of FIG. 4B.

The fragile portion 30 is intersecting slits formed in the upper surface of flange 22 (that is, on a surface of flange 22 that is opposite the semiconductor element 10 side). The upper surface of flange 22 is a surface opposite to the side in which the circular recesses where formed in the first embodiment (see e.g., FIG. 2A, element 30). Additionally, in the second embodiment, as depicted in FIGS. 3B and 4A, the fragile portions 30 are positioned outside (in radial direction) of the bent portion of flange 22, depicted as the dotted line in FIG. 3B.

More specifically, in this second embodiment the fragile portion 30 comprises grooves (recesses) cut in a cross shape. By providing slits in a cross shape, the fragile portion 30 forms a portion wherein the thickness of the first flange 22 is locally thin.

Consequently, the fragile portion 30 has low mechanical strength, and low resistance against pressure. The slit depth and the like of the fragile portion 30 is set such that the fragile portion 30 has the lowest resistance against pressure of the whole configuration of the semiconductor device including the first flange 22 and second flange 24.

While depicted in FIG. 4A as being formed in an upper surface of first flange 22, the cross-shaped fragile portion 30 may also be formed in the lower surface of first flange 22, that is, the surface on the semiconductor element 10 side. However, high pressure is exerted on the first flange 22 from the lower surface side when the semiconductor element 10 breaks down. Consequently, deformation such that the first flange 22 is pressed and bent from the lower surface side occurs in the first flange 22. Consequently, breakdown is more likely to occur when the cross-shaped slits are provided in the upper surface of the first flange 22. Therefore, it is typically preferable that the intersecting slits be formed in the upper surface, that is, the surface on the side opposite to that of the semiconductor element 10, of the first flange 22.

As heretofore described, according to this embodiment too, a pressure-contact semiconductor device that suppresses explosion and has high reliability is realized.

Although the above description has the fragile portion 30 being provided in the first flange 22 as an example, the fragile portion 30 may be instead (or also) provided in the second flange 24.

Also, the shape of the intersecting slits forming the fragile portion 30, not being limited to a cross shape, may be other shapes, such as a hash mark shape (#).

Third Embodiment

The semiconductor device according to this embodiment is similar to the first embodiment, excepting that the fragile portion 30 with locally low resistance against pressure is provided in both the first connection portion (first flange 22) and second connection portion (second flange 24).

Figure 5:
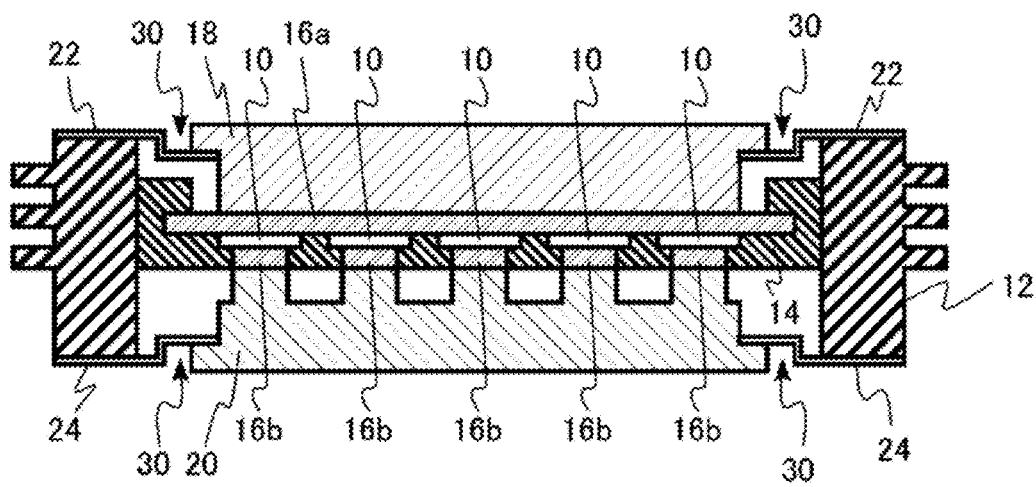
FIG. 5 is a schematic view of a semiconductor device according to a third embodiment.

FIG. 5 is a schematic view of the semiconductor device according to this third embodiment. As shown in FIG. 5, the fragile portion 30 with locally low resistance against pressure is provided in both the first flange 22 and second flange 24.

According to this embodiment, it is possible to prevent the semiconductor device from exploding even when the pressure rises on only one of the first surface side and second surface side of the semiconductor element 10.

Consequently, according to this embodiment, a pressure-contact semiconductor device having still higher reliability is realized.

Fourth Embodiment

The semiconductor device according to this fourth embodiment is similar to the first embodiment, excepting that the first electrode block 18 and first connection portion (first flange 22) are molded integrally. Consequently, a description of details duplicating those according to the first embodiment will be omitted.

Figure 6:
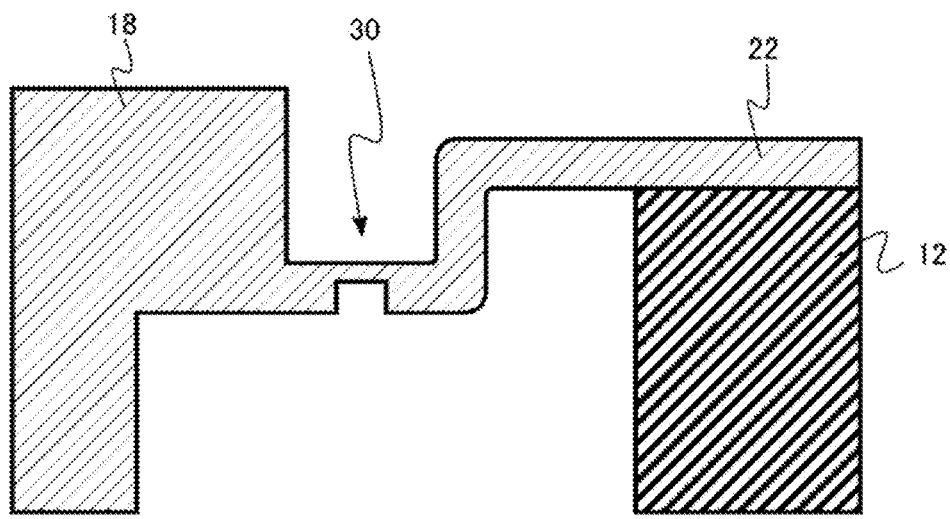
FIG. 6 is a schematic view of a main portion of a semiconductor device according to a fourth embodiment.

FIG. 6 is a schematic view of a main portion of the semiconductor device according to this fourth embodiment. As shown in FIG. 6, the first electrode block 18 and first flange 22 are molded integrally of the same material. That is, first electrode block 18 and first flange 22 are different portions of a same element.

Also according to this embodiment, a pressure-contact semiconductor device that suppresses explosion and has high reliability is realized.

Fifth Embodiment

The semiconductor device according to this fifth embodiment is similar to the first embodiment, excepting that the fragile portion 30 with locally low resistance against pressure comprises a hole 40 provided in the first connection portion (first flange 22) and a cover portion 42 covering the hole.

Figure 7A:
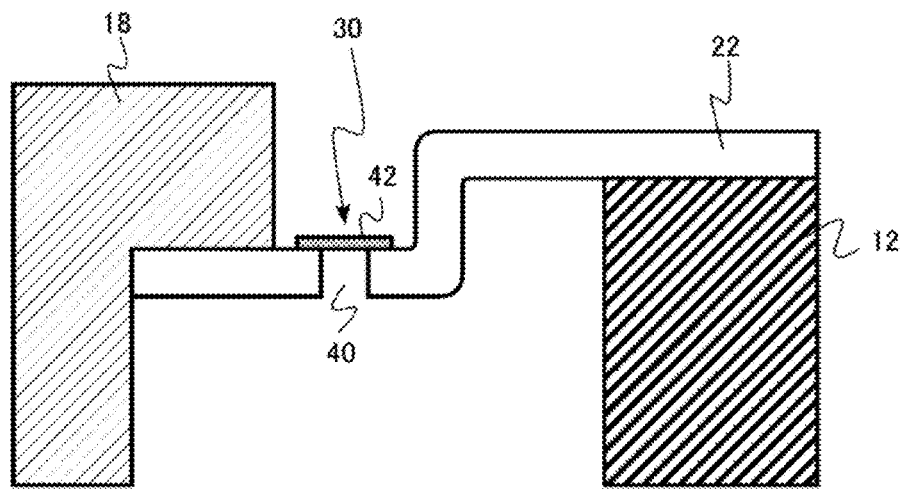
FIGS. 7A and 7B are schematic views of a main portion of a semiconductor device according to a fifth embodiment.
Figure 7B:
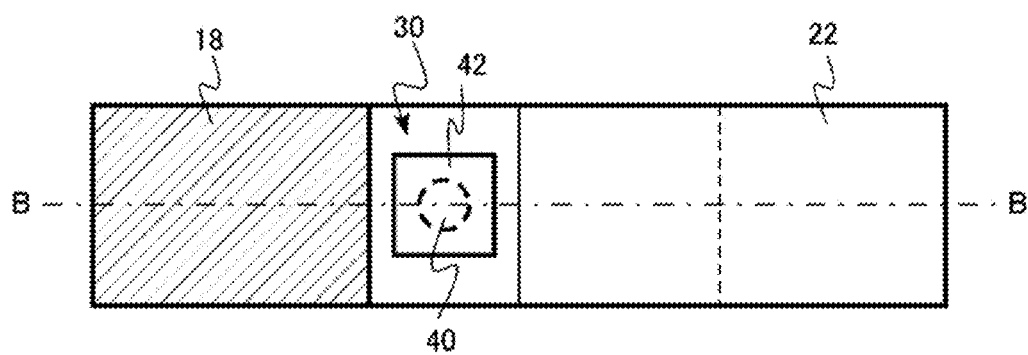

FIGS. 7A and 7B are schematic views of a main portion of the semiconductor device according to this fifth embodiment. FIG. 7A is a schematic sectional view, and FIG. 7B is a schematic top view. FIG. 7A is a sectional view along BB of FIG. 7B.

The fragile portion 30 comprises a hole 40 penetrating the first flange 22, and a cover portion 42 that covers the hole 40 on the upper surface, that is, the surface on the side opposite to that of the semiconductor element 10, of the first flange 22. The material of the cover portion 42, the method of connecting the cover portion 42 to the first flange 22, and the like, are not particularly limited. It is sufficient that the above-mentioned material, connection method, and the like, are selected so that the fragile portion 30 has the lowest resistance against pressure of the whole configuration of the semiconductor device including the first flange 22 and second flange 24.

As heretofore described, according to this embodiment, a pressure-contact semiconductor device that suppresses explosion and has high reliability is realized. Also, as the cover portion 42 is formed as a member separate to the first flange 22, there are advantages in that, for example, control of the breakdown pressure of the fragile portion 30 is relatively easy, and design change is also relatively easy.

Although the above description has the fragile portion 30 being provided in the first flange 22 as an example, the fragile portion 30 (comprising in this embodiment a hole 40 and a cover 42) may be provided in the second flange 24.

Also, the cover portion 42 may be of a configuration such as to cover the hole 40 on the lower surface, that is, the surface on the semiconductor element 10 side, of the first flange 22.

Sixth Embodiment

The semiconductor device according to this sixth embodiment is similar to the first embodiment, excepting that a member 44 with a melting point lower than that of the first connection portion 22 is provided in the first connection portion 22.

Figure 8A:
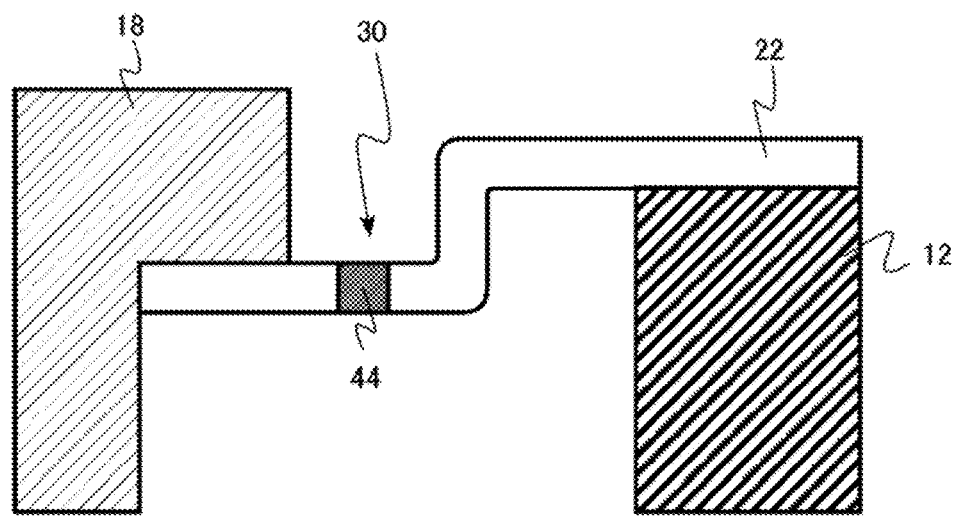
FIGS. 8A and 8B are schematic views of a main portion of a semiconductor device according to a sixth embodiment.
Figure 8B:
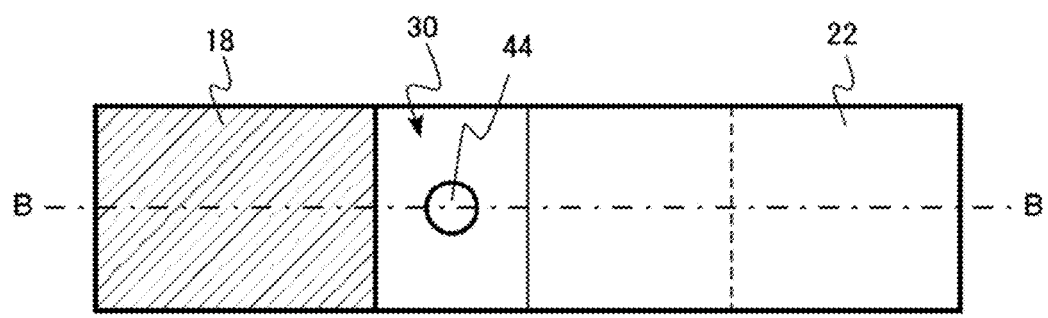

FIGS. 8A and 8B are schematic views of a main portion of the semiconductor device according to this embodiment. FIG. 8A is a schematic sectional view, and FIG. 8B is a schematic top view. FIG. 8A is a sectional view along BB of FIG. 8B.

The fragile portion 30 is formed of a hole penetrating the first flange 22, and a member 44 comprising a material with a melting point lower than that of the first flange 22, fills the hole. For example, when the first flange 22 is of copper, it is possible to use lead, tin, zinc, or the like, for the material of member 44.

The fragile portion 30 forms a region with locally low resistance to temperature. The material, thickness, and the like, of the fragile portion 30 are set so that the fragile portion 30 has the lowest resistance to temperature of the whole configuration of the semiconductor device including the first flange 22 and second flange 24.

According to this sixth embodiment, the member 44 of the fragile portion 30 melts, and a hole opens in the first flange 22 before explosion occurs because the semiconductor element 10 breaks down and the internal temperature rises. Because of this, the internal pressure is released and drops, thus preventing explosion. Therefore, fragments of the semiconductor device are prevented from scattering and damaging circuits, cooling devices, and the like, on the periphery of the semiconductor device.

As heretofore described, according to this sixth embodiment too, a pressure-contact semiconductor device that suppresses explosion and has high reliability is realized. Also, as the member 44 is formed as a member separate to the first flange 22, there are advantages in that, for example, control of the breakdown pressure of the fragile portion 30 is easy, and design change is also easy.

Although the above description has the fragile portion 30 being provided in the first flange 22 as an example, the fragile portion 30 may also (or instead) be provided in the second flange 24.

Also, adopting, for example, a plate-form member as the member 44, the configuration may be such as to cover a hole provided in the first flange 22 on the upper surface side or lower surface side of the first flange 22, as in the fifth embodiment with a lower melting point material rather than filling the hole formed in the flange with the lower melting point material The embodiments described above have the fragile portion 30 being provided in a plurality of places as an example. A configuration wherein the fragile portion 30 is provided in a plurality of places is preferable when a rise in pressure or a rise in temperature occurs locally due to breakdown of the semiconductor element 10. However, it is also possible to adopt a configuration wherein the fragile portion 30 is in only one place.

Also, the embodiments are described with a plurality of the semiconductor element 10 being disposed inside the semiconductor device as an example, but is also possible for only one semiconductor element 10 to be disposed therein.

Also, although the embodiments are described with the semiconductor element 10 being a PIN diode as an example, the semiconductor element 10 may be another semiconductor element, such as a metal-oxide-semiconductor field-effect transistor (MOSFET), an insulated gate bipolar transistor (IGBT), a gate turn-off thyristor (GTO), or an injection enhanced gate transistor (IEGT). In the case of a three terminal element such as a MOSFET, it is sufficient to adopt a configuration wherein an electrode other than the first electrode block and second electrode block is additionally provided in the semiconductor device.

Also, although the embodiments are described with a silicon element as an example of the semiconductor element 10, it is also possible to apply another silicon element, such as a SiC element or a GaN series semiconductor element.

Also, although the embodiments are described with the insulating frame body 12 being cylindrical as an example, the frame body 12, not being limited to being cylindrical, may be of another form, such as rectangular.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor element disposed in a frame body and including a first electrode;
   a first electrode block provided on a first side of the semiconductor element and electrically connected to the first electrode; and
   a first connection element that connects the first electrode block and the frame body, wherein
   the semiconductor element is sealed in an enclosure comprising the frame body, the first connection element, and the first electrode block, and
   the first connection element includes a fragile portion formed therein that has a resistance to at least one of a pressure increase and a temperature increase that is less than other portions of the first connection element.

2. The semiconductor device of claim 1, wherein the first connection element includes a plurality of fragile portions.

3. The semiconductor device of claim 1, wherein the fragile portion has a thickness that is less than a thickness of other portions of the first connection element.

4. The semiconductor device of claim 1, wherein the fragile portion comprises a recess formed in a first surface of the first connection element, the first surface of the first connection element being on a same side of the first connection element as the semiconductor element.

5. The semiconductor device of claim 4, wherein the recess is circular.

6. The semiconductor device of claim 1, wherein the fragile portion comprises a recess formed in a first surface of the first connection element, the first surface of the first connection element being on a side that is opposite a semiconductor element side of the first connection element.

7. The semiconductor device of claim 6, wherein the recess comprises intersecting grooves.

8. The semiconductor device of claim 1, wherein the first electrode block and the first connection element are formed of a same material.

9. The semiconductor device of claim 1, wherein the fragile portion comprises a hole penetrating the first connection element.

10. The semiconductor device of claim 9, wherein the hole is covered by a plate.

11. The semiconductor device of claim 9, wherein the hole is filled with a material having a melting point that is lower than a melting point of a material of other portions of the first connection element.

12. The semiconductor device of claim 1, further comprising:
    a second electrode block provided on a second side of the semiconductor element opposite the first side and electrically connected to a second electrode of the semiconductor element; and
    a second connection element that connects the second electrode block and the frame body, wherein the enclosure also comprises the second connection element and the second electrode block.

13. The semiconductor device of claim 12, wherein the second connection element includes a fragile portion formed therein that has a resistance to at least one of a pressure increase and a temperature increase that is less than other portions of the second connection element.

14. A semiconductor device, comprising:
    a semiconductor element disposed in a frame body and including a first electrode and a second electrode;
    a first electrode block provided on a first side of the semiconductor element and electrically connected to the first electrode;
    a second electrode block provided on a second side of the semiconductor element opposite the first side and electrically connected to the second electrode;
    a first connection element that connects the first electrode block and the frame body; and
    a second connection element that connects the second electrode block and the frame body, wherein
    the semiconductor element is sealed in an enclosure comprising the frame body, the first connection element, the second connection element, the first electrode block, and the second electrode block, and
    at least one of the first connection element and second connection element includes a fragile portion formed therein that has a resistance to at least one of a pressure increase and a temperature increase that is less than other portions of the respective first or second connection element including the fragile portion.

15. The semiconductor device of claim 14, wherein both the first and second connection elements include a fragile portion.

16. The semiconductor device of claim 14, further comprising:
    a plurality of semiconductor elements disposed in a common plane and spaced from each other by a resin body connected to the frame body, wherein
    the first and second electrode blocks have a circular shape when viewed from a direction orthogonal to the common plane.

17. The semiconductor device of claim 14, further comprising:
    a metal plate between the semiconductor element and the first electrode block, the metal plate having a thermal expansion coefficient which is closer to a thermal expansion coefficient of the semiconductor element than a thermal expansion coefficient of the first electrode block.

18. A semiconductor device, comprising:
    a plurality of semiconductor elements disposed in a frame body and spaced from each other in a common plane by a resin body connected to the frame body, each semiconductor element including a first electrode and a second electrode;
    a first electrode block provided on a first side of the plurality of semiconductor elements and electrically connected to each first electrode;
    a second electrode block provided on a second side of the plurality of semiconductor elements opposite the first side and electrically connected to each second electrode;
    a first connection element that connects the first electrode block and the frame body, the first connection element having a first level portion contacting the first electrode block and a second level portion contacting the frame body, the first level portion being a first distance from the common plane, and the second level portion being a second distance from the common plane that is greater than the first distance; and
    a second connection element that connects the second electrode block and the frame body, wherein the plurality of semiconductor elements is sealed in an enclosure comprising the frame body, the first connection element, the second connection element, the first electrode block, and the second electrode block, and the first connection element includes a fragile portion formed therein that has a resistance to at least one of a pressure increase and a temperature increase that is less than other portions of the first connection element.

19. The semiconductor device of claim 18, wherein the fragile portion is formed in the first level portion of the first connection element.

20. The semiconductor device of claim 18, wherein the fragile portion is formed in the second level portion of the first connection element.

\* \* \* \* \*